United States Patent
Au et al.

(10) Patent No.: US 6,451,698 B1
(45) Date of Patent: Sep. 17, 2002

(54) SYSTEM AND METHOD FOR PREVENTING ELECTROCHEMICAL EROSION BY DEPOSITING A PROTECTIVE FILM

(75) Inventors: Wing kei Au; Albert H. Liu, both of San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/287,320

(22) Filed: Apr. 7, 1999

(51) Int. Cl.[7] ............................................. H01L 21/302
(52) U.S. Cl. ...................... 438/692; 438/694; 438/695; 438/700; 438/703
(58) Field of Search ................................ 438/692, 695, 438/700, 703, 754, 723

(56) References Cited

U.S. PATENT DOCUMENTS

| | | | | |
|---|---|---|---|---|
| 5,447,887 A | * | 9/1995 | Filipiak et al. | 438/689 |
| 5,612,254 A | * | 3/1997 | Mu et al. | 438/637 |
| 5,679,982 A | * | 10/1997 | Gardner | 257/758 |
| 5,770,095 A | * | 6/1998 | Sasaki et al. | 216/38 |
| 5,824,599 A | * | 10/1998 | Schacham-Diamand et al. | 438/678 |
| 5,892,285 A | * | 4/1999 | Gonzalez et al. | 257/763 |
| 5,985,751 A | * | 11/1999 | Koyama | 438/637 |
| 6,008,117 A | * | 12/1999 | Hong et al. | 438/629 |

\* cited by examiner

Primary Examiner—Benjamin L. Utech
Assistant Examiner—Binh X. Tran
(74) Attorney, Agent, or Firm—Peter Zawilski

(57) ABSTRACT

A method for making reliable interconnect structures on a semiconductor substrate having a first dielectric layer is disclosed. The method includes depositing a glue layer of TiN followed by tungsten chemical vapor deposition after the contact or via is defined in the dielectric. Then, tungsten etchback or Chemical Mechanical Polishing (CMP) is performed to remove the tungsten and TiN over the dielectric surface with slight dishing of the tungsten within the plug. Next, a blanket deposition of Copper by electrochemical deposition is performed and Copper CMP is used to remove the copper from the dielectric surface while maintaining a coating of copper over the tungsten in the plug. Then, metal stack deposition, patterning and metal etching is performed and a barrier layer of silicon nitride is presented to minimize the copper diffusion. Finally, a deposition of an Interlevel Dielectric (ILD) is deposited. The deposition of a protective material such as copper above the tungsten in the plug blocks the dissolution pathway of tungsten in the highly alkaline post metal etch strip solvent. Copper is used as an example due to its favorable characteristic of being deposited and polished commercially, and the relatively low volatility of etch products (CuCl or $CuCl_2$) during the metal etch whereas $Cl_2/BCl_3$ is the typical etch chemistry employed in semiconductor manufacturing. The deposition of silicon nitride after metal etch is essential to minimize the out-diffusion of copper into upper level dielectrics whereas the TiN glue layer minimizes the copper diffusion from the side of the vias or the contact.

23 Claims, 8 Drawing Sheets

SYSTEM AND METHOD FOR PREVENTING ELECTROCHEMICAL EROSION BY DEPOSITING A PROTECTIVE FILM

FIELD OF THE INVENTION

The present invention relates generally to semiconductor manufacture and, more particularly, to a method for fabricating reliable interconnect structures in semiconductor integrated circuits, and more particularly to protection of the interconnecting structures using a protective metallic film.

BACKGROUND OF THE INVENTION

Interconnect structures of integrated circuits (ICs) generally take the form of patterned metallization lines that are used to electrically interconnect devices and to provide interconnection with external circuitry. By way of example, IC devices may include complementary metal oxide semiconductor ("CMOS") devices having diffused source and drain regions that are separated by channel regions, and gates that are located over the channel regions. In practice, an IC chip may include thousands or millions of devices, such as CMOS transistors.

Conventionally, a dielectric layer (e.g., silicon dioxide) is deposited over the devices that are formed on a substrate, and via holes are formed through the dielectric layer to the devices below. As is well known in the art, photolithography "patterning" is typically accomplished by depositing a photoresist layer over the dielectric layer, selectively exposing the photoresist to light through a patterned reticle having via hole patterns, developing the photoresist to form a photoresist via mask, and etching the exposed dielectric layer to form the via holes that lead to a lower level. Once the via holes are formed, a conductive material such as tungsten (W) is used to fill the via holes to define what are known as "tungsten plugs." Once the tungsten plugs are formed, a metallization layer is formed over the dielectric layer and the tungsten plugs. The metallization layer is then patterned using conventional photolithography and plasma etching techniques to define a first level of interconnect metal routing. This process may then be repeated if additional layers of interconnect structures are desired.

To facilitate discussion, a semiconductor substrate will typically have a number of layers fabricated thereon. In this example, the semiconductor substrate has a first dielectric layer deposited over its surface, and a first metallization layer patterned over the first dielectric layer. A second dielectric layer is then deposited over the first dielectric layer and the first metallization layer. Before a second metallization layer is patterned over the second dielectric layer, via holes are etched and filled with a tungsten material to form tungsten plugs. At this point, the second metallization layer is plasma etched to define the desired interconnect lines.

As is well known, conventional plasma etching will cause the semiconductor substrate to be negatively charged, and all metallization features and tungsten plugs (i.e., unless they are coupled to the substrate) to be positively charged. Once the plasma etching is complete, the substrate is conventionally moved to a basic solution cleaning station where it is submerged in an effort to remove any polymer residues produced during the plasma etching.

Although the basic solution submersing works well in removing the polymer residues, if any one of the tungsten plugs are exposed to the basic solution, the tungsten material will erode away (also known in the art as "corrosion"). Tungsten plugs are completely covered by the second metallization layer, however, a path remains exposing the tungsten plug. As mentioned above, because the first metallization layer and the second metallization layer are not coupled to the substrate (i.e., the structure is a floating structure), they will be positively charged and therefore the tungsten plug will erode. The erosion also varies proportionally to the potential when the pH is above a certain value. If any tungsten plugs erode, the entire IC chip may fail to operate for its intended purpose, thereby driving up fabrication costs.

Because CMOS semiconductor circuits are continuing to decrease in size, and more devices are packed into smaller IC chips, more densely integrated interconnect structures will be required. However, this dense integration has the effect of pushing the limits of conventional photolithography patterning, which necessarily makes photolithography mask misalignments more likely to occur. Of course, when more misalignments occur, more paths will result, thereby increasing the number of exposed tungsten plugs.

Chemical Mechanical Polishing (CMP) is widely used for manufacturing semiconductors. CMP is very effective for planarizing geometries that are not widely isolated. CMP processes planarize the surface of semiconductor wafers to a desired thickness. In a typical CMP process, a wafer attached to a carrier is pressed against a polishing pad in the presence of a slurry. The slurry contains abrasive particles that mechanically remove material from the wafer and chemicals that chemically treat the material that is ultimately polished. Waste material eventually accumulates on the planarizing surface of the polishing pad during planarization which diminishes the pad's effectiveness. The waste matter on the pad reduces the effectiveness and the uniformity of the planarizing surface of the polishing pad. The waste matter accordingly reduces throughput of the CMP process and the uniformity of the polished surface on the wafer. Accordingly, it is necessary to periodically clean the planarizing surface of a polishing pad. Planarizing surfaces of polishing pads are conventionally cleaned by brushing the pad with a stiff brush, but U.S. Pat. No. 5,616,069 teaches a method of using a pad scrubber to clean the planarizing surface of a polishing pad used in CMP processing of semiconductor wafers. The pad scrubber has a fluid manifold and a plurality of nozzles coupled to the manifold to clean the pad as it is used in the CMP process. U.S. Pat. No. 5,816,891 discloses a method and apparatus for performing chemical mechanical polishing of oxides and metals using sequential removal on multiple polish platens to increase equipment throughput. U.S. Pat. No. 5,852,497 to the common assignee of this patent application discusses Shallow Trench Isolation (STI) for semiconductor manufacture wherein chemical mechanical polishing (CMP) is utilized to planarize the topography of the alignment marks. Because the polysilicon layer is opaque to the conventional white light source and the HeNe source, and because the alignment marks have been planarized, boundaries between different materials are used to form the alignment marks.

In view of the foregoing, there is a need for improved CMOS fabrication techniques that prevent any exposed tungsten plugs from eroding during the basic solvent cleaning operation. Other disadvantages of prior solutions included the tungsten plug remaining intact after the solvent strip of a wafer was discharged utilizing an ionic solution, such as water. Moreover, noticeable corrosion of the aluminum lines on the semiconductor lead to less than optimal semiconductor yield. Thus, tight control of the solvent pH is very critical for successful manufacture of semiconductors to provide a persisting film of sufficient quality on the tungsten or corrosion of aluminum is likely to occur in the same range of pH.

SUMMARY OF THE INVENTION

Broadly speaking, the present invention fills these needs by providing a method that prevents exposed tungsten plugs from eroding during standard CMOS fabrication. It should be appreciated that the present invention can be implemented in numerous ways, including as a process, an apparatus, a system, a device, or a method. Several inventive embodiments of the present invention are described below.

In one embodiment, a method for making reliable interconnect structures on a semiconductor substrate having a first dielectric layer is disclosed. The method includes depositing a glue layer of TiN followed by tungsten chemical vapor deposition after the contact or via is defined in the dielectric. Then, tungsten etchback or Chemical Mechanical Polishing (CMP) is performed to remove the tungsten and TiN over the dielectric surface with slight dishing of the tungsten within the plug. Next, a blanket deposition of Copper by electrochemical deposition is performed and Copper CMP is used to remove the copper from the dielectric surface while maintaining a coating of copper over the tungsten in the plug. Then, metal stack deposition, patterning and metal etching is performed and a barrier layer of silicon nitride is presented to minimize the copper diffusion. Finally, a deposition of an Interlevel Dielectric (ILD) is deposited.

The deposition of a protective material such as copper above the tungsten in the plug blocks the dissolution pathway of tungsten in the highly alkaline post metal etch strip solvent. Copper is used as an example due to its favorable characteristic of being deposited and polished commercially, and the relatively low volatility of the etch products (CuCl or $CuCl_2$) during the metal etch whereas $Cl_2/BCl_3$ is the typical etch chemistry employed in semiconductor manufacturing. The deposition of silicon nitride after metal etch is essential to minimize the out-diffusion of copper into upper level dielectrics whereas the TiN glue layer minimizes the copper diffusion from the side of the vias or the contact. In addition to copper, one of ordinary skill in the art will readily comprehend that TiW could be substituted with similar results.

TiW has a lower etch rate than other substances so a barrier layer would not be necessary.

One advantage of the present invention is that very reliable interconnect structures can be fabricated without the danger of losing tungsten plugs to erosion (i.e., also known as "corrosion") in a basic solution used to remove post plasma etching polymer residues. Other aspects and advantages of the invention will become apparent from the following detailed description, taken in conjunction with the accompanying drawings, illustrating by way of example the principles of the invention.

DESCRIPTION OF THE DRAWINGS

The foregoing and other objects, aspects and advantages are better understood from the following detailed description of a preferred embodiment of the invention with reference to the drawings, in which.

DETAILED DESCRIPTION

Figure 1:
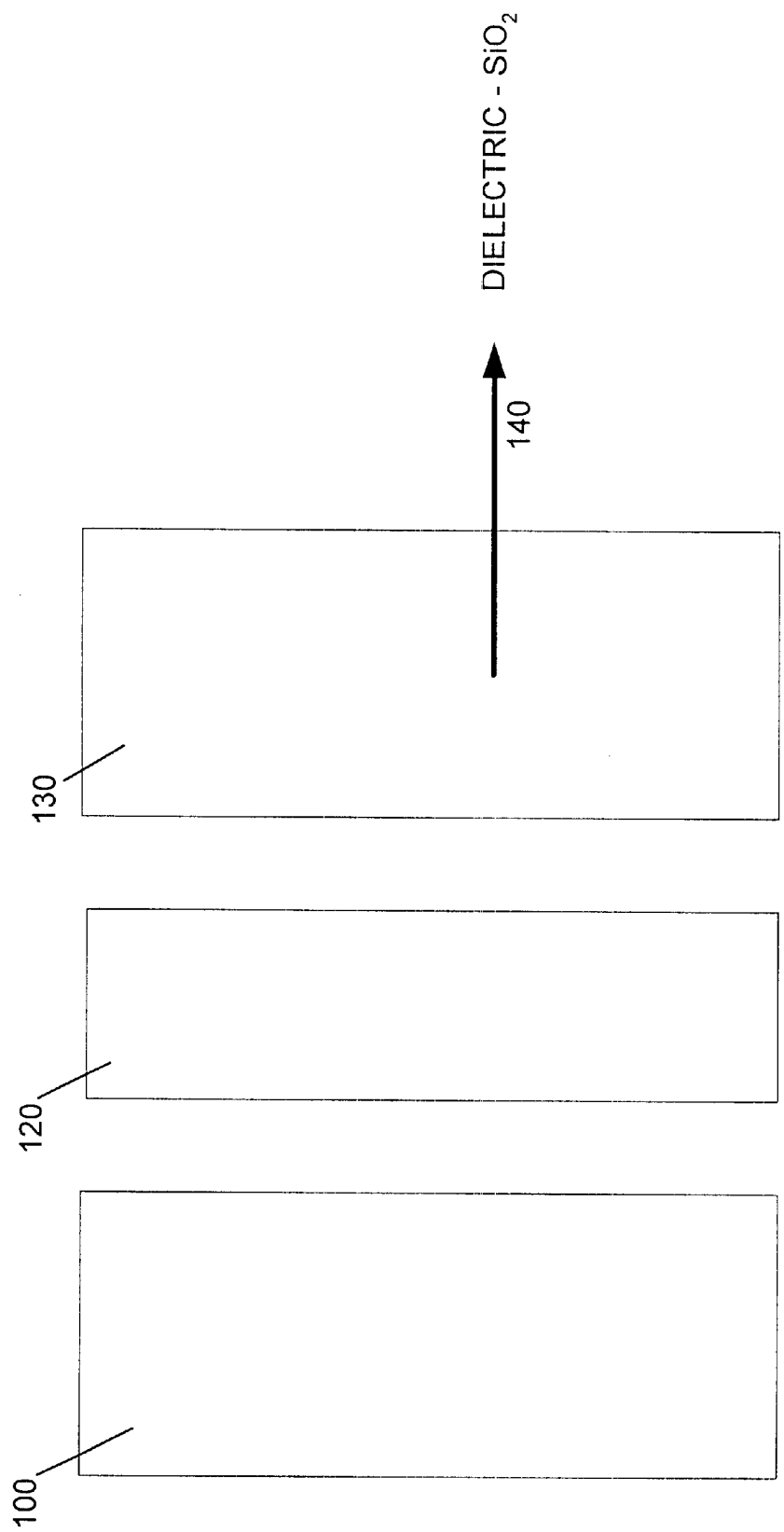
FIG. 1 is a block diagram of a contact or VIA masking, etch and strip operation in accordance with a preferred embodiment.

An invention that prevents exposed tungsten plugs from eroding during standard CMOS fabrication is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

The objectives of the semiconductor industry are to continually improve the performance of silicon devices, while maintaining or decreasing the cost of these devices. The ability to manufacture silicon chips, exhibiting sub-micron features, have in part, allowed the performance and cost objectives to be realized. For example silicon devices, fabricated with specific sub-micron features, result in larger decreases in performance degrading resistance and capacitance, then counterparts fabricated using less aggressive designs. In addition the ability to produce smaller silicon chips, due to the use of smaller features, allows more chips to be produced from a specific size starting silicon substrate. Since the processing cost for the silicon substrate remains the same, the cost of an individual silicon chip is reduced.

The use of sub-micron features, or the trend to micro-miniaturization, has been achieved as a result of advances or development of several semiconductor fabrication disciplines, such as photolithography, and dry etching. The use of more sophisticated exposure cameras, as well as the development of more sensitive photoresist materials, have allowed sub-micron images to be routinely produced in photoresist layers. In addition the development of selective, anisotropic, dry etching processes, have allowed these sub-micron images in photoresist layers, to be successfully transferred to underlying materials, used for the fabrication of advanced silicon devices.

However with the trend to micro-miniaturization, difficulties are encountered with specific semiconductor fabrication sequences, that had not been present for counterparts fabricated using larger device features. For example via or contact holes, used to interconnect two levels of metallization, or used to connect an overlying metallization to an underlying silicon device region, become more difficult to fill with a conductive material, such as aluminum, using metal deposition processes, such as evaporation or sputtering. Chemically vapor deposited processes supply superior fill characteristics, however it is difficult to chemically vapor deposit aluminum. In addition the use of aluminum, to fill via or contact holes, is limited due to the combination of increased current carrying demands, arising as a result of micro-miniaturization, and the poor current carrying characteristics of aluminum.

Therefore the industry has preferred to use tungsten as a fill material for small diameter contact holes, taking advantage of the improved conformality properties of the chemically vapor deposited tungsten, and the enhanced current carrying characteristics of tungsten.

One specific shortcoming of the use of chemically vapor deposited, metal fills, is the seam or dimple in the fill. The metal fill proceeds by the mechanism of the depositing metal film, coating the sides of the contact hole. At a specific point, where the coated sides converge, a seam or dimple can evolve. Subsequent processing, such as dry etching used to remove unwanted metal from areas outside the contact hole, can aggravate the seam and produce a metal void, in the center of the contact or via hole. The void now offers a severe topology for subsequent interconnect metallizations, which can sometimes result in yield or reliability problems. Therefore the semiconductor industry has offered many solutions for the seam or dimple phenomena, encountered when using chemically vapor deposited metal films, specifically tungsten, to fill small diameter contact holes. One such solution, used to alleviate the dimple or seam phenomena for tungsten fills, has been to use a two stage dry etching process to remove unwanted tungsten, from areas outside the tungsten filled contact hole.

The second stage of the dry etching procedure, performed at different conditions than the previous etching stage, remove tungsten residuals without significant attack of the tungsten in the contact hole, thus not aggravating the seam. The solution offered in this invention concentrates on a specific set of tungsten deposition conditions that allow for improved tungsten conformality, in turn allowing the fill to be successfully completed with a minimum of deposited metal. This results in a shorter etch back sequence, thus less exposure of tungsten seam to the etch back process. An article published by S. Bothra, H. Sur and V. Liang, entitled, "A New Failure Mechanism by Corrosion of Tungsten in a Tungsten Plug Process" discusses a tungsten filled via plug process commonly used in sub-half micron CMOS process technologies and is incorporated in its entirety by reference to assist one of ordinary skill in the art in making and using a preferred embodiment.

A preferred embodiment provides a method that prevents exposed tungsten plugs from eroding during standard CMOS fabrication. It should be appreciated that the present invention can be implemented in numerous ways, including as a process, an apparatus, a system, a device, or a method. Several inventive embodiments of the present invention are described below.

In one embodiment, a method for making reliable interconnect structures on a semiconductor substrate having a first dielectric layer is disclosed. The method includes depositing a glue layer of TiN followed by tungsten chemical vapor deposition after the contact or via is defined in the dielectric. Then, tungsten etchback or Chemical Mechanical Polishing (CMP) is performed to remove the tungsten and TiN over the dielectric surface with slight dishing of the tungsten within the plug. Next, a blanket deposition of Copper by electrochemical deposition is performed and Copper CMP is used to remove the copper from the dielectric surface while maintaining a coating of copper over the tungsten in the plug. Then, metal stack deposition, patterning and metal etching is performed and a barrier layer of silicon nitride is presented to minimize the copper diffusion. Finally, a deposition of an Interlevel Dielectric (ILD) is deposited.

The deposition of a protective material such as copper above the tungsten in the plug blocks the dissolution pathway of tungsten in the highly alkaline post metal etch strip solvent. Copper is used as an example due to its favorable characteristic of being deposited and polished commercially, and the relatively low volatility of the etch products (CuCl or $CuCl_2$) during the metal etch whereas $Cl_2/BCl_3$ is the typical etch chemistry employed in semiconductor manufacturing. The deposition of silicon nitride after metal etch is essential to minimize the out-diffusion of copper into upper level dielectrics whereas the TiN glue layer minimizes the copper diffusion from the side of the vias or the contact.

One advantage of the present invention is that very reliable interconnect structures can be fabricated without the danger of losing tungsten plugs to erosion (i.e., also known as "corrosion") in a basic solution used to remove post plasma etching polymer residues.

FIG. 1 is a block diagram of a contact or VIA masking, etch and strip operation in accordance with a preferred embodiment. Masking, etch and strip operations are well known in the semiconductor art. Channels are formed between the various dielectric blocks 100, 120 and 130 of silicon dioxide 140. The channels are produced by patterning a composite layer of silicon nitride on silicon dioxide, using conventional photolithographic and reactive ion etching processes. After photoresist removal, using oxygen plasma ashing, followed by wet cleans, the composite insulator pattern is used as an oxidation mask.

Next, the composite insulator pattern is removed, using, for example, hot phosphoric acid for the silicon nitride layer, and a buffered hydrofluoric acid solution for the underlying silicon dioxide layer, a thin silicon dioxide, gate insulator is grown to a thickness between about 50 to 300 Angstroms, in an oxygen-steam ambient. A polysilicon layer is next deposited using low pressure chemical vapor deposition, (LPCVD), processing, at a temperature between about 500° C. to 700° C., to a thickness between about 2000 to 4000 Angstroms. The polysilicon can be deposited intrinsically and doped via ion implantation of phosphorous or arsenic at an energy between about 50 to 100 Kev., at a dose between about $1\times10^{15}$ to $1\times10^{16}$ atoms/cm$^2$. Another alternative is to deposit the polysilicon layer using in situ doping procedures via incorporation of either phosphine or arsine to a silane ambient. Conventional photolithographic and RIE processing, using $Cl_8$ as an etchant, are used to create polysilicon gate structure shown schematically in FIG. 1.

After photoresist removal, via oxygen plasma ashing and wet cleans, an N type, lightly doped source and drain region, is created via ion implantation of phosphorous, at an energy between about 30 to 60 Kev., at a dose between about $1\times10^{12}$ to $1\times10^{13}$ atoms/cm$^2$. A silicon oxide layer is next deposited using either LPCVD or plasma enhanced chemical vapor deposition, (PECVD), processes, at a temperature between about 400° C. to 800° C., using tetraethylorthosilicate as a source, to a thickness between about 1500 to 4000 Angstroms. An anisotropic, selective RIE process, using $CHF_3$ as an etchant, is used to create insulator sidewall spacer. Another ion implantation procedure, using arsenic at an energy between about 50 to 100 Kev., at a dose between about $1\times10^{14}$ to $1\times10^{15}$ atoms/cm$^2$, is used to create the N+, heavily doped source and drain region.

An insulator layer of silicon oxide, 8, is deposited using either LPCVD, PECVD, or atmospheric pressure chemical vapor deposition, (APCVD), processing, at a temperature between about 300° C. to 800° C., to a thickness between about 5000 to 10000 Angstroms, and planarized using chemical mechanical polishing procedures. Columns are formed in the silicon oxide layer via use of standard photolithographic and RIE procedures, using an etchant. The trend to micro-miniaturization demands contact holes with diameters in the sub-micron range, therefore the aspect ratio, the ratio of the depth of the contact hole divided by the diameter of the contact hole opening, using aggressive groundrules, can be large and therefore present difficulties when attempting to fill using conventional metal deposition procedures.

Figure 5:
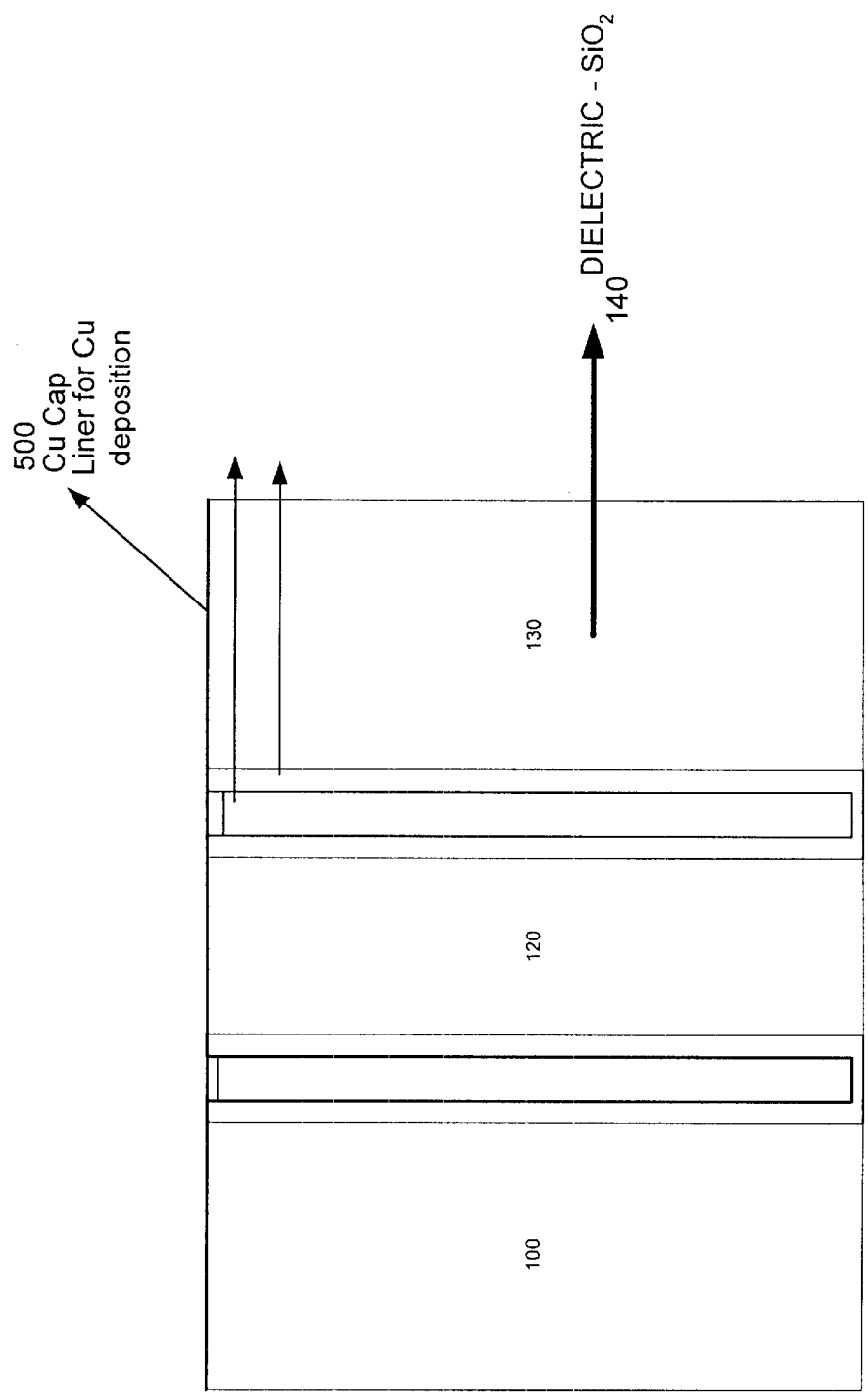
FIG. 5 illustrates a post tungsten Copper Chemical Mechanical Polishing (CMP) in accordance with a preferred embodiment.

A process will now be described in which the seam, inherent in chemically vapor deposited metals, when used to fill large aspect ratio, contact holes, is minimized. Referring back to FIG. 1, a large channel is opened in silicon oxide layer, 140, via anisotropic RIE, using an etchant between blocks 100, 120 and 130. After a buffered hydrofluoric acid treatment is used to remove any native oxide from the surface of source and drain region, a titanium layer, 200, is deposited using r.f. sputtering, to thickness between about 200 to 500 Angstroms. This layer is used to provide ohmic contact to underlying device regions, and to improve the adhesion of subsequent metallization layers, to underlying silicon oxide surfaces. Next a layer of titanium nitride, is deposited using r.f. sputtering, to a thickness between about 50 to 1000 Angstroms. Subsequent tungsten deposition 210, using decomposition of tungsten hexafluoride, can produce by-products that can attack exposed silicon or titanium regions, thus the titanium nitride layer, 15, shown schematically in FIG. 5, is used as a barrier layer, against this possible attack.

Figure 2:
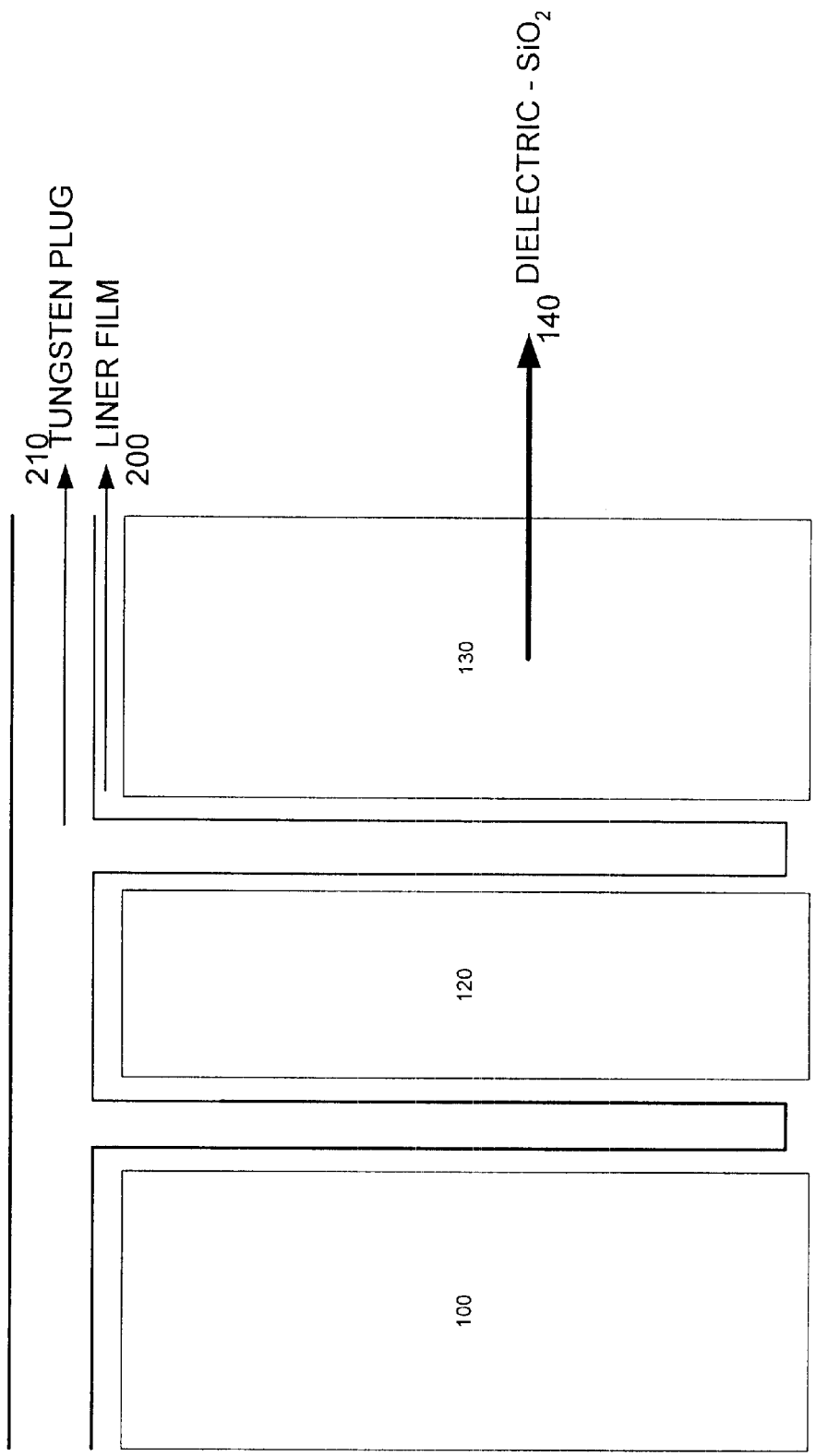
FIG. 2 illustrates a post liner and tungsten deposition operation in accordance with a preferred embodiment.

The tungsten fill process is next performed using deposition conditions to create a tungsten plug 210 that will result in superior step coverage, thus enabling the minimum of tungsten thickness to be used to fill the large aspect ratio, contact hole. The deposition of tungsten layer, 210, is again performed using a decomposition of tungsten hexafluoride, LPCVD processing, again at a temperature between about 300° C. to 600° C., but now with a deposition rate of only about 4000 Angstroms/min., resulting in a thickness between about 3000 to 6000 Angstroms. Therefore the superior step coverage, tungsten fill, achieved via use of the above conditions, basically the reduced deposition rate, allows contact holes as narrow as 0.4 $\mu$m, to be adequately filled with as little as 3000 Angstroms of tungsten. FIG. 2 illustrates this post liner and tungsten deposition operation in accordance with a preferred embodiment.

Figure 3:
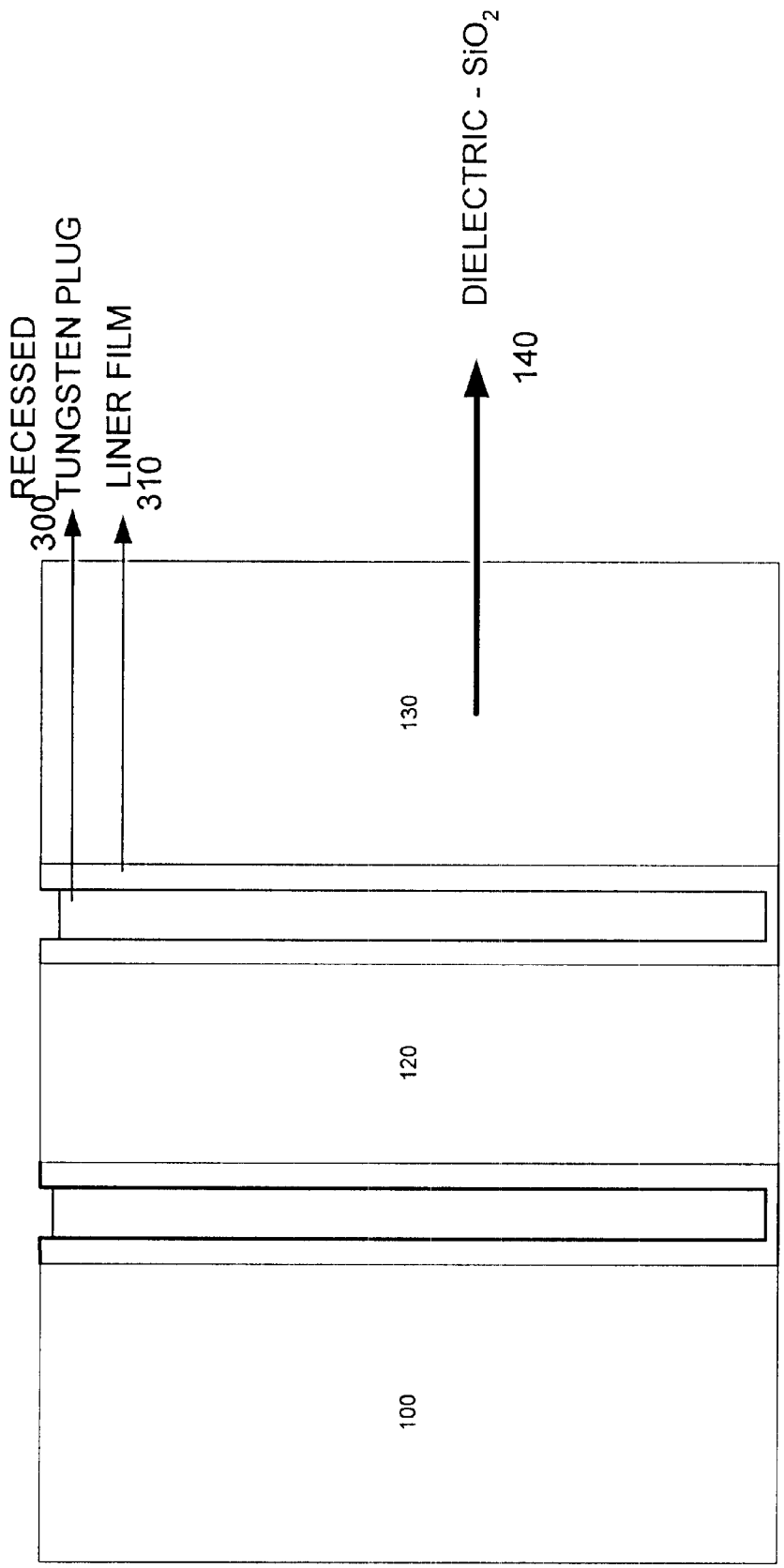
FIG. 3 illustrates a post tungsten Chemical Mechanical Polishing (CMP)/Etchback operation in accordance with a preferred embodiment.

A post tungsten CMP/etch back process is then used to remove unwanted tungsten from the top surface of silicon oxide layer, is next carried out via selective, RIE, processing, using as an etchant. The result of this etch back process is shown in FIG. 3. The RIE etch back step, includes an overetch performed to insure complete removal of tungsten, even in areas where non-uniformities may have existed. The amount of overetch, if excessive, can deleteriously effect an exposed seam in the tungsten fill. Therefore it is important to minimize the overetch, therefore protecting the exposed seam, and this is made possible by using a thin, uniform tungsten layer, obtained via use of the tungsten deposition conditions. FIG. 3 illustrates the post tungsten Chemical Mechanical Polishing (CMP)/Etchback operation in accordance with a preferred embodiment.

Figure 4:
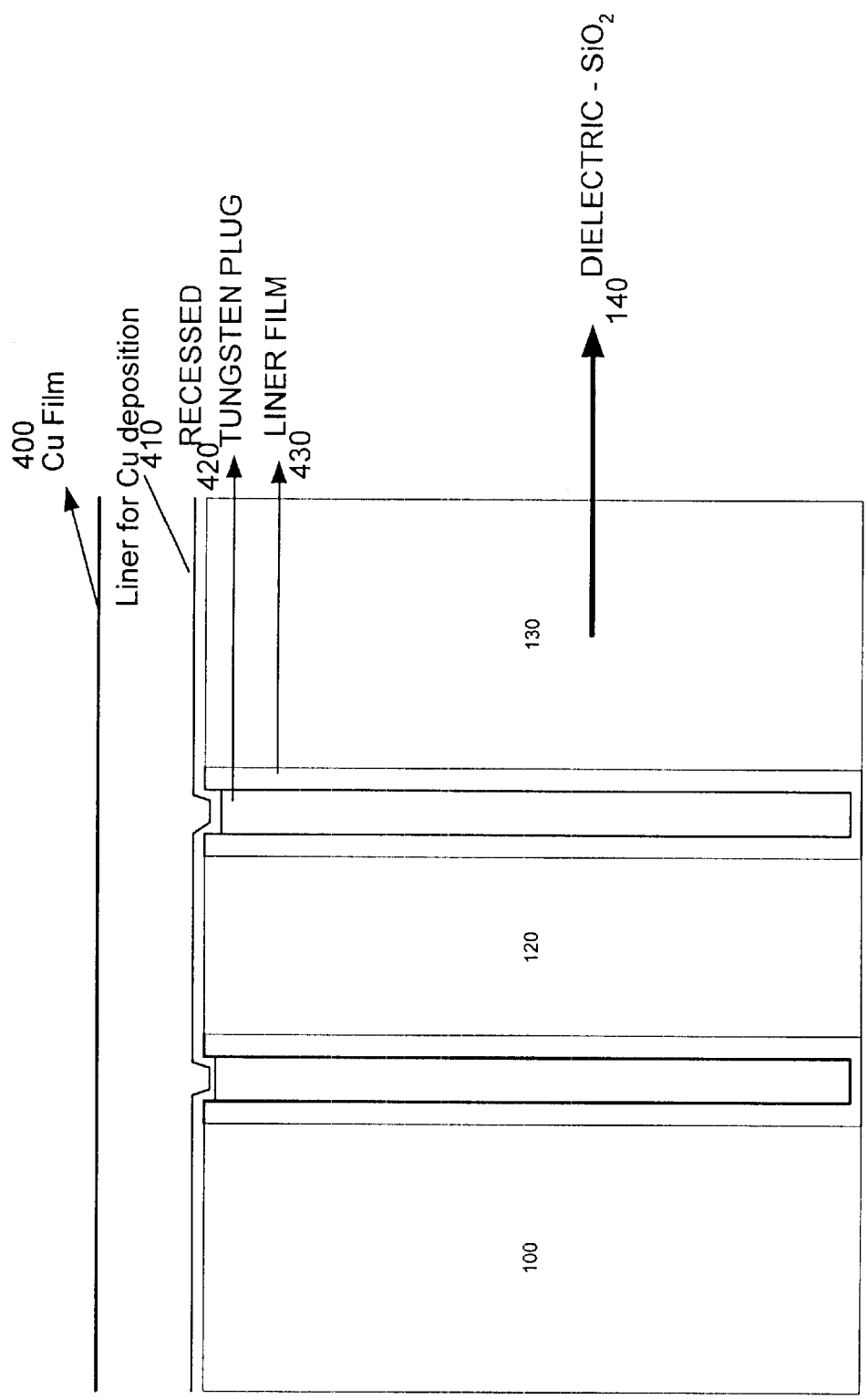
FIG. 4 illustrates a post liner and Copper deposition operation in accordance with a preferred embodiment.

FIG. 4 illustrates a post liner and Copper deposition operation in accordance with a preferred embodiment. As shown at 420, the overetch portion of the RIE etch back process results in the tungsten fill, or tungsten plug, being recessed to a level approximately equal to the surface of titanium layer. Another RIE process is then performed, using an etchant, to remove titanium nitride layer, as well as titanium layer, while removing tungsten at a much slower rate, resulting in a structure in which the top surface of the tungsten plug, 420, is at the same level as the top surface of silicon oxide layer. Also, a liner for copper deposition 410 is placed on top of the recessed tungsten plug 420 to protect the tungsten from being eroded by a copper film 400 that is placed on top of the liner 410.

The metallization layer of aluminum, containing between about 0.5 to 2.0% copper, and between about 0.5 to 3.0% silicon, is deposited using seed deposition, PVD or electrochemical deposition, to a thickness between about 3000 to 8000 Angstroms. Conventional photolithographic and RIE processes, using an etchant, are used to create an interconnect metallization structure. The aluminum interconnect structure, 400, does not exhibit thinning or poor conformality. This is due to aluminum deposition being performed on a less severe topology, without excessive tungsten seams or voids. Thus the risk of yield or electromigration problems is greatly reduced. Photoresist removal is once again performed via oxygen plasma ashing, followed by careful wet cleans.

This process, although shown for tungsten fills, used to fill contact holes which connect an overlying interconnect metallization structure to an underlying active silicon device region, can also be applied for tungsten filling of via holes, used to connect two levels of interconnect metallizations. In addition this process although shown as an application for an N channel, (NFET), device, can also be applied to P channel, (PFET), devices, complimentary (CMOS), devices, as well as to BiCMOS devices.

FIG. 5 illustrates a post tungsten Copper Chemical Mechanical Polishing (CMP) in accordance with a preferred embodiment. CMP processes planarize the surface of semiconductor wafers to a desired thickness. In a typical CMP process, a wafer attached to a carrier is pressed against a polishing pad in the presence of a slurry. The slurry contains abrasive particles that mechanically remove material from the wafer and chemicals that chemically treat the material that is ultimately polished. Waste material eventually accumulates on the planarizing surface of the polishing pad during planarization which diminishes the pad's effectiveness. The waste matter on the pad reduces the effectiveness and the uniformity of the planarizing surface of the polishing pad. The waste matter accordingly reduces throughput of the CMP process and the uniformity of the polished surface on the wafer. Accordingly, it is necessary to periodically clean the planarizing surface of a polishing pad. Planarizing surfaces of polishing pads are conventionally cleaned by brushing the pad with a stiff brush. The resultant copper cap 500 has copper removed from the dielectric surface. However, the copper remains over the tungsten in the plug. Copper is used because of its high feasibility for being deposited and polished commercially, and the relatively low volatility of the etch product during the metal etch.

Figure 6:
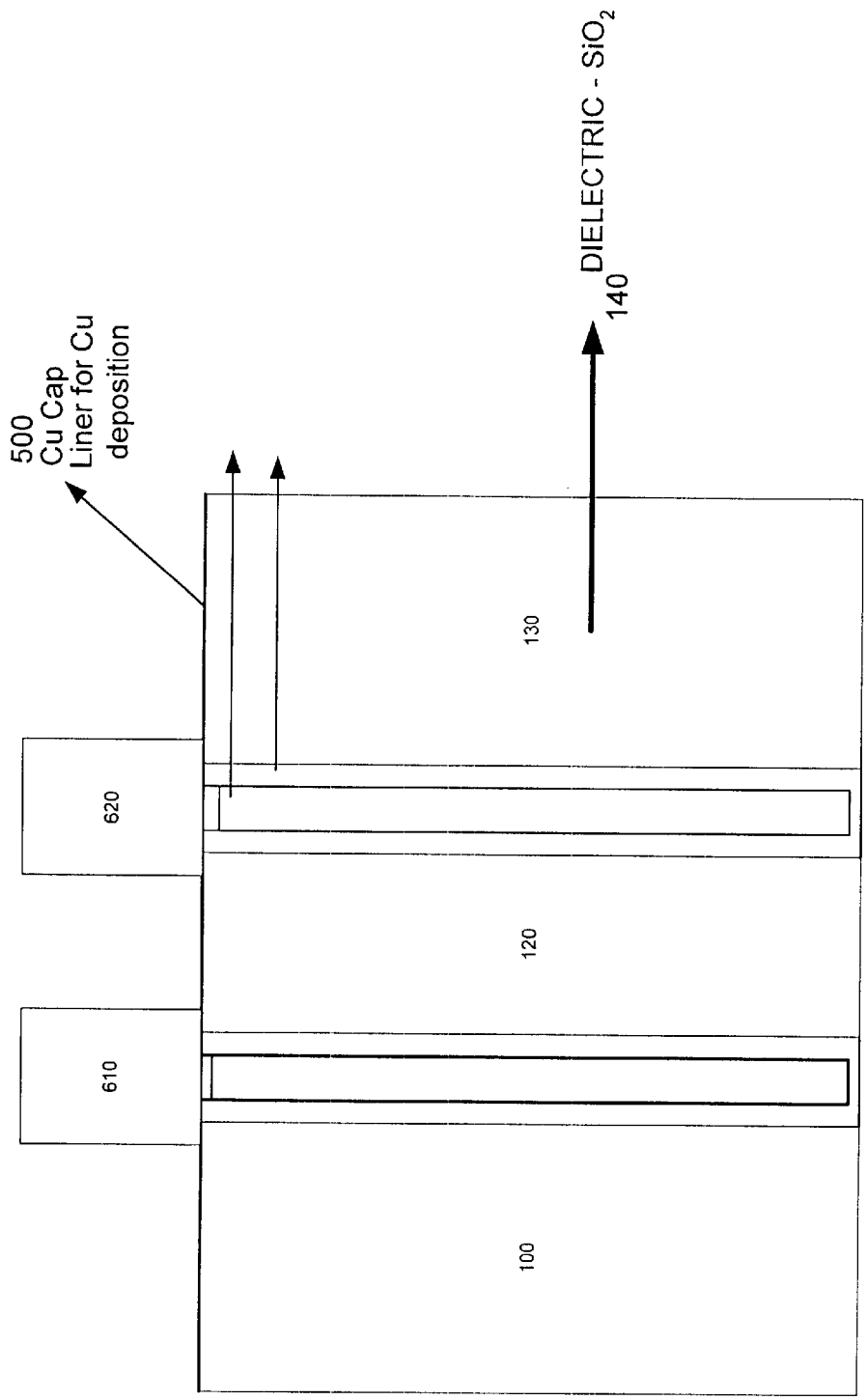
FIG. 6 illustrates a post metal deposition, masking, etch and strip operation in accordance with a preferred embodiment.
Figure 7:
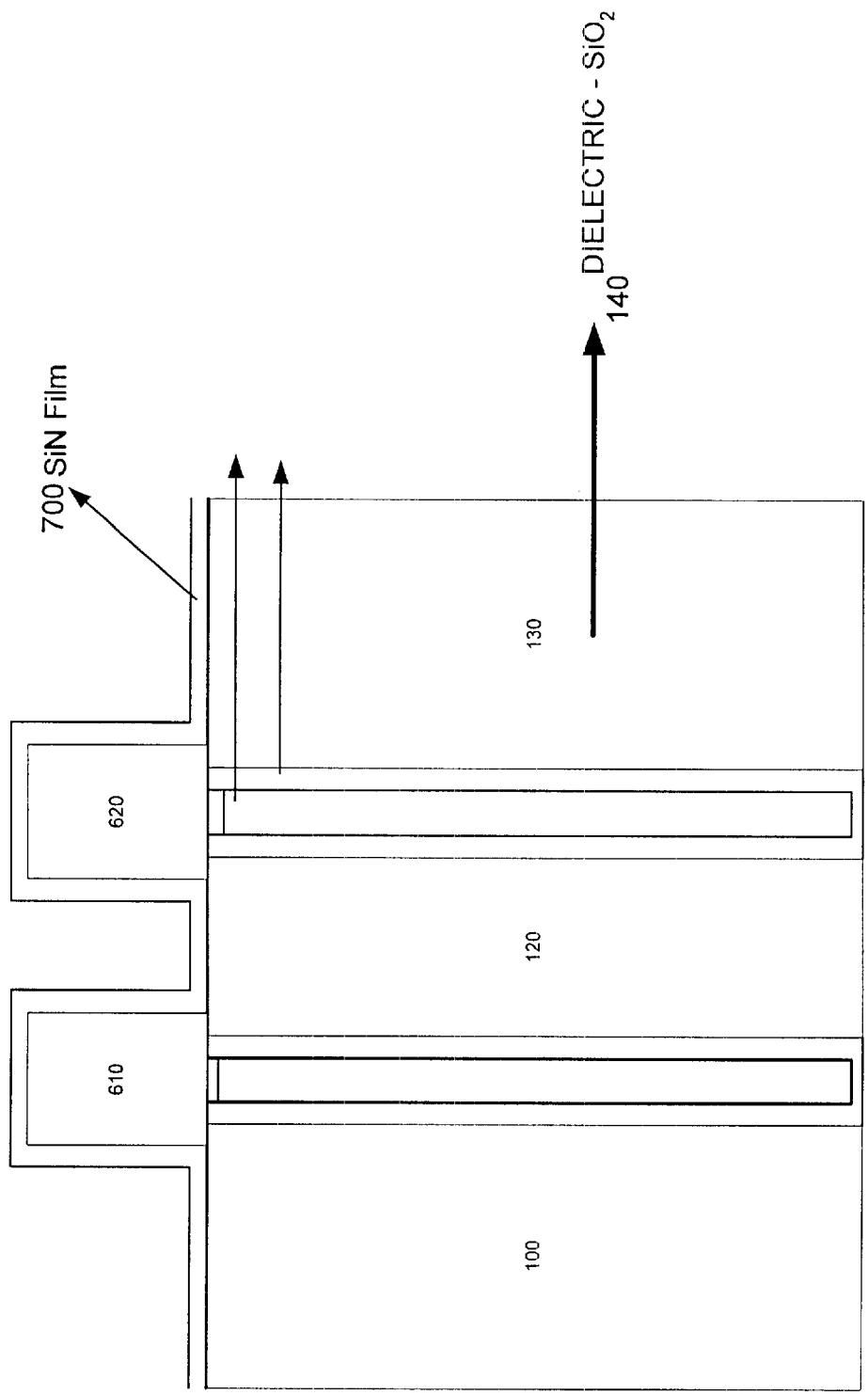
FIG. 7 illustrates a SiN deposition operation designed to prevent Copper diffusion in accordance with a preferred embodiment.

FIG. 6 illustrates a post metal deposition, masking, etch and strip operation in accordance with a preferred embodiment. Metal stacks 610 and 620 are deposited with pattern and metal etching with a deposition of silicon nitride after the metal etch to minimize the out-diffusion of copper into the upper level dielectrics whereas the TiN glue layer minimizes the copper diffusion from the side of the vias or contact. FIG. 7 illustrates a SiN deposition 700 operation designed to prevent copper diffusion in accordance with a preferred embodiment.

Figure 8:
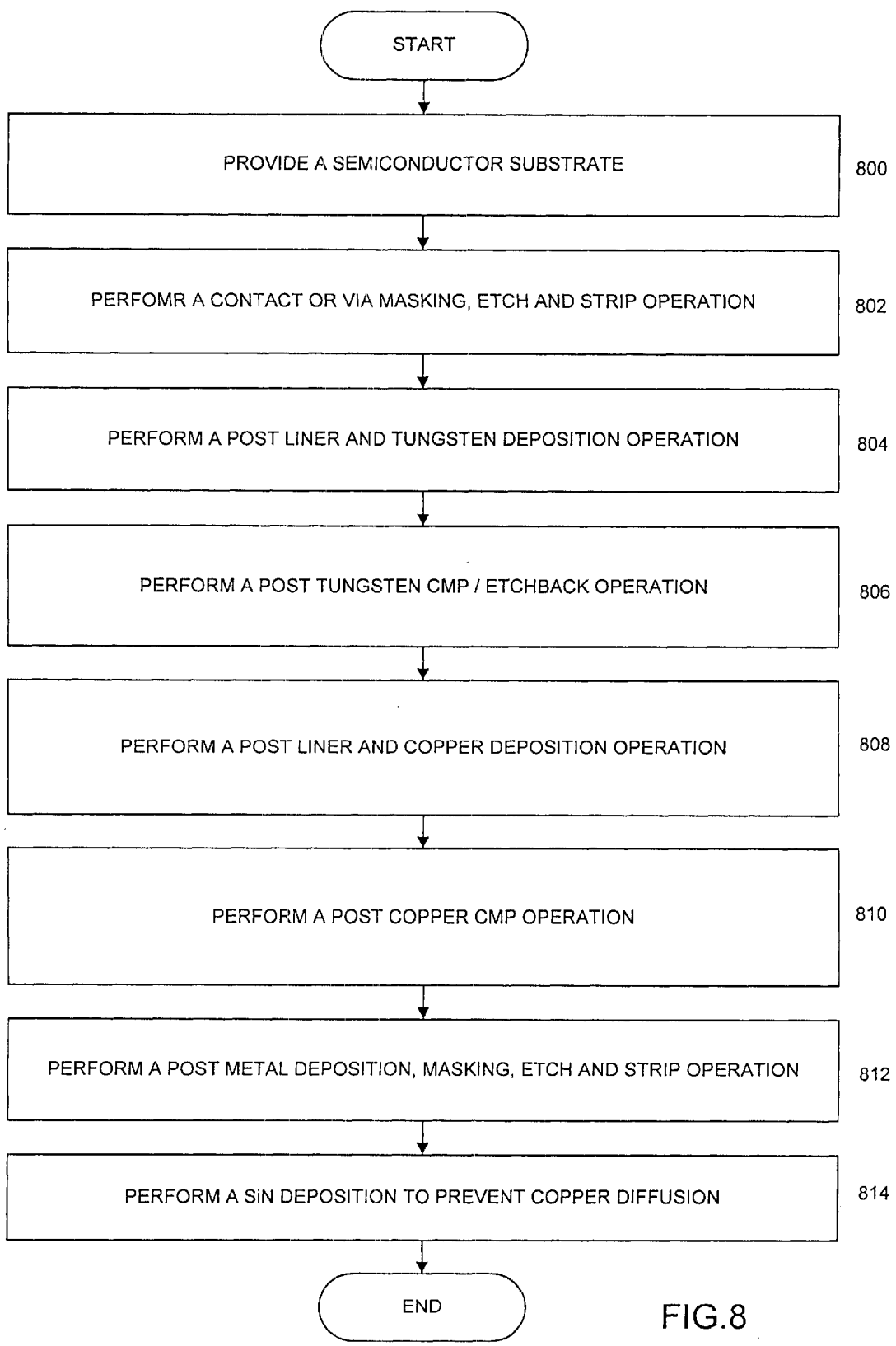
FIG. 8 illustrates a flowchart of the operation in accordance with a preferred embodiment.

FIG. 8 illustrates a flowchart illustrating the preferred method of operations used in fabricating reliable interconnect structures in accordance with an embodiment of the present invention. The method begins at an operation 800 where a semiconductor substrate is provided. In general, the semiconductor substrate may be any substrate that may benefit from reliable tungsten plugs that are used in interconnect structures. The method then proceeds to an operation 802 where a contact or via masking, etch and strip operation are performed on the semiconductor substrate. Once the processing in operation 802 is complete, the method will proceed to an operation 804 where a post liner and tungsten deposition operation is performed. Then, a post tungsten CMP/etchback operation is performed as shown in function block 806, and a post liner and copper deposition operation is performed as shown in function block 808. Then, as shown in function block 810, a post copper CMP operation is performed, and a post metal deposition, masking, etch and strip operation is performed as illustrated in function block 812. Finally, as illustrated in function block 814, a SiN deposition operation is performed to prevent copper diffusion.

In operation 804, a plurality of tungsten plugs are formed into the second dielectric layer such that electrical contact is made with the patterned lower metallization layer. Of course, it is a general intention that the tungsten plugs be completely covered by an overlying metallization line, however, photolithography misalignments tend to prevent perfect overlaps.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making reliable interconnect structures on a semiconductor substrate, comprising:

forming an interconnect via having sidewalls in a dielectric layer having a top surface, said dielectric layer being formed over a semiconductor substrate;

forming a sidewall liner on the sidewalls of the via;

depositing a tungsten layer over the top surface of said dielectric layer to form a tungsten plug in said via in contact with the sidewall liner;

removing the tungsten from the top surface of the dielectric layer such that a top surface of said tungsten plug is below the top surface of said dielectric layer;

forming a cap liner upon the top surface of the tungsten plug; and forming a copper cap within the cap liner.

2. A method for making reliable interconnect structures on a semiconductor substrate as recited in claim 1, including the step of pre-processing the semiconductor substrate using a contact or via mask.

3. A method for making reliable interconnect structures on a semiconductor substrate as recited in claim 1, including the step of pre-processing the semiconductor substrate using an etch operation.

4. A method for making reliable interconnect structures on a semiconductor substrate as recited in claim 1, including the step of pre-processing the semiconductor substrate using a strip operation.

5. A method for making reliable interconnect structures on a semiconductor substrate as recited in claim 1, wherein the step of removing the tungsten includes performing a post tungsten chemical mechanical polishing operation.

6. A method for making reliable interconnect structures on a semiconductor substrate as recited in claim 1, wherein the step of removing the tungsten includes performing a post tungsten etchback operation.

7. A method for making reliable interconnect structures on a semiconductor substrate as recited in claim 1, further comprising the step of performing a coating operation on the resultant interconnect structure of a semiconductor substrate to prevent copper diffusion utilizing a SiN deposition.

8. A method for making reliable interconnect structures on a semiconductor substrate as recited in claim 1, including the step of performing a post metal deposition operation.

9. A method for making reliable interconnect structures on a semiconductor substrate as recited in claim 1, including the step of performing a post metal etch operation.

10. A method for making reliable interconnect structures on a semiconductor substrate, comprising:

forming a contact in a dielectric of a semiconductor substrate;

forming a sidewall liner on sidewalls of the contact;

depositing a layer of tungsten over the dielectric to form a tungsten plug in the contact with the sidewall liner;

over-etching the tungsten to remove the tungsten from the top surface of the dielectric, therein recessing an upper surface of the tungsten beneath the top surface of the dielectric;

depositing a liner over the tungsten plug;

depositing a layer of copper on the liner on the tungsten deposition;

performing chemical mechanical polishing on the resultant semiconductor substrate; and performing a coating operation on the resultant interconnect structure of the semiconductor substrate to prevent copper diffusion.

11. A method for making reliable interconnect structures on a semiconductor substrate as recited in claim 10, wherein the step of depositing a liner over the tungsten plug includes depositing a glue layer on the semiconductor substrate followed by tungsten chemical vapor deposition.

12. A method for making reliable interconnect structures on a semiconductor substrate as recited in claim 10, including the step of chemical mechanical polishing to remove tungsten over the dielectric surface with dishing of tungsten within the plug.

13. A method for making reliable interconnect structures on a semiconductor substrate as recited in claim 10, wherein the step of depositing a layer of copper on the liner on the tungsten deposition is accomplished utilizing electromechanical deposition.

14. A method for making reliable interconnect structures on a semiconductor substrate as recited in claim 10, wherein the step of depositing a layer of copper on the liner on the tungsten deposition is accomplished utilizing seed deposition.

15. A method for making reliable interconnect structures on a semiconductor substrate as recited in claim 10, wherein the step of depositing a layer of copper on the liner on the tungsten deposition is accomplished utilizing PVD.

16. A method for making reliable interconnect structures on a semiconductor substrate as recited in claim 10, wherein the step of performing chemical mechanical polishing on the resultant semiconductor substrate to remove copper over the dielectric surface while still covering the tungsten.

17. A method for making reliable interconnect structures on a semiconductor substrate as recited in claim 10, including the step of metal stack deposition on the semiconductor substrate.

18. A method for making reliable interconnect structures on a semiconductor substrate as recited in claim 10, including the step of patterning on the semiconductor substrate.

19. A method for making reliable interconnect structures on a semiconductor substrate as recited in claim 10, including the step of metal etching on the semiconductor substrate.

20. A method for making reliable interconnect structures on a semiconductor substrate as recited in claim 10, wherein the coating operation on the resultant interconnect structure of a semiconductor substrate to prevent copper diffusion utilizes silicon nitride as a barrier layer to minimize copper difusion.

21. The method as recited in claim 10, wherein the step of forming a sidewall liner on the sidewalls of the contact utilizes titanium deposition.

22. The method as recited in claim 10, further comprising the step of depositing a liner on the sidewall liner deposited on the sidewalls of the contact.

23. The method as recited in claim 22, wherein the step of depositing a liner on the sidewall liner on the contact utilizes titanium nitride deposition.

* * * * *